United States Patent [19]
Lehmann et al.

[11] Patent Number: 5,260,612
[45] Date of Patent: Nov. 9, 1993

[54] BI-LEVEL DUAL MODE TRANSCEIVER

[75] Inventors: Guenter H. Lehmann, Dallas; William L. Payne, II, Garland, both of Tex.

[73] Assignee: Dallas Semiconductor Corp., Dallas, Tex.

[21] Appl. No.: 627,662

[22] Filed: Dec. 14, 1990

[51] Int. Cl.$^5$ .................. H03K 19/092; H03K 17/16
[52] U.S. Cl. .................. 307/475; 307/296.1
[58] Field of Search .................. 307/296.1, 475, 243

[56] References Cited
U.S. PATENT DOCUMENTS

| | | | |
|---|---|---|---|
| 4,417,320 | 11/1983 | Ei | 307/475 |
| 4,791,323 | 12/1988 | Austin | 307/475 |
| 4,853,560 | 8/1989 | Iwamura et al. | 307/475 |
| 4,947,406 | 8/1990 | Yokoyama | 307/475 |
| 4,996,453 | 2/1991 | Zanders et al. | 307/475 |
| 5,047,663 | 9/1991 | Lee et al. | 307/475 |

*Primary Examiner*—Edward P. Westin
*Assistant Examiner*—Richard Roseen
*Attorney, Agent, or Firm*—Worsham, Forsythe, Sampels & Wooldridge

[57] ABSTRACT

A transceiver (100) for TTL and RS232 communication with automatic sensing (130) of the type of input and adjustment of the output to correspond together with current stealing (131) from the input communication lines to provide extreme voltages for transmission. Hysteresis and surge suppression are built into the sensing.

6 Claims, 7 Drawing Sheets

BI-LEVEL DUAL MODE TRANSCEIVER

CROSS-REFERENCE TO RELATED APPLICATIONS

The following copending U.S. Pat. applications disclose related subject matter: Ser. Nos. 07/386,823, now U.S. Pat. No. 5,047,663; 07/386,098, now U.S. Pat. No. 5,003,362; 07/387,462, now abandoned; 07/387,467, now U.S Pat. No. 5,032,742; 07/387,471, now U.S. Pat. No. 5,025,177; 07/387,546, now U.S. Pat. No. 4,996,453 all filed Jul. 28, 1989, and 07/628,808 now abandoned, 07/627,663, and 07/628,915 now abandoned, all filed herewith. These cross-referenced applications are all assigned to the assignee of the present application.

BACKGROUND AND SUMMARY OF THE INVENTION

The present invention relates to electronic devices, and, more particularly, to low-power data communication over a serial channel.

Battery-powered and portable electronic modules and systems have found increasing applications due to advantages such as: portability; improved immunity to electrical noise; nonvolatile memory; improved safety; lighter weight; improved capaciltiy for international marketing; and simplified regulatory requirements. Battery-powered systems demand very low power for long battery lifetime and small battery size.

However, serial data communication with conventional protocols implemented in a straightforward fashion consumes significant power and would quickly drain a battery.

For example, the RS232 standard, widely used in microcomputer systems, specifies a 3 to 7 Ω load resistor connected to ground, and the RS232 data line will normally remain in the mark state (typically at −12 volts) when idle and alternate between marks and spaces (typically at +12 volts). Thus a substantial current must be sourced when transmitting with a straightforward implementation, and if the data lines remain connected after a communications session has ended, power will statically flow into the transmitters and drain a battery. Despite this power consumption, the RS232 has a number of advantages: it is already widely used, the connections are simple (only a receive line RX, a transmit line TX, and ground line), and the standards are actually somewhat flexible in practice. Thus efforts have been made to design RS232 interfaces that extend performance; see for example, U.S. Pat. No. 4,607,170 and the Cross-Referenced Applications.

Battery-powered systems frequently must support both RS-232 and TTL interfaces, but it is a problem with the known interfaces to distinguish between RS232 and TTL operation.

The present invention provides a transceiver with automatic operation for both RS232 and TTL interfaces by sensing of the received voltage levels to determine the mode of operation, and senses the negative levels of RS232 inputs to steal current with surge protection to provide output transmitter power, and includes hysteresis on the negative level sensing and provides selectable output levels, slew rates, polarities together with selectable input impedances and polarities.

DESCRIPTION OF THE PREFERRED EMBODIMENTS

Figure 1A:
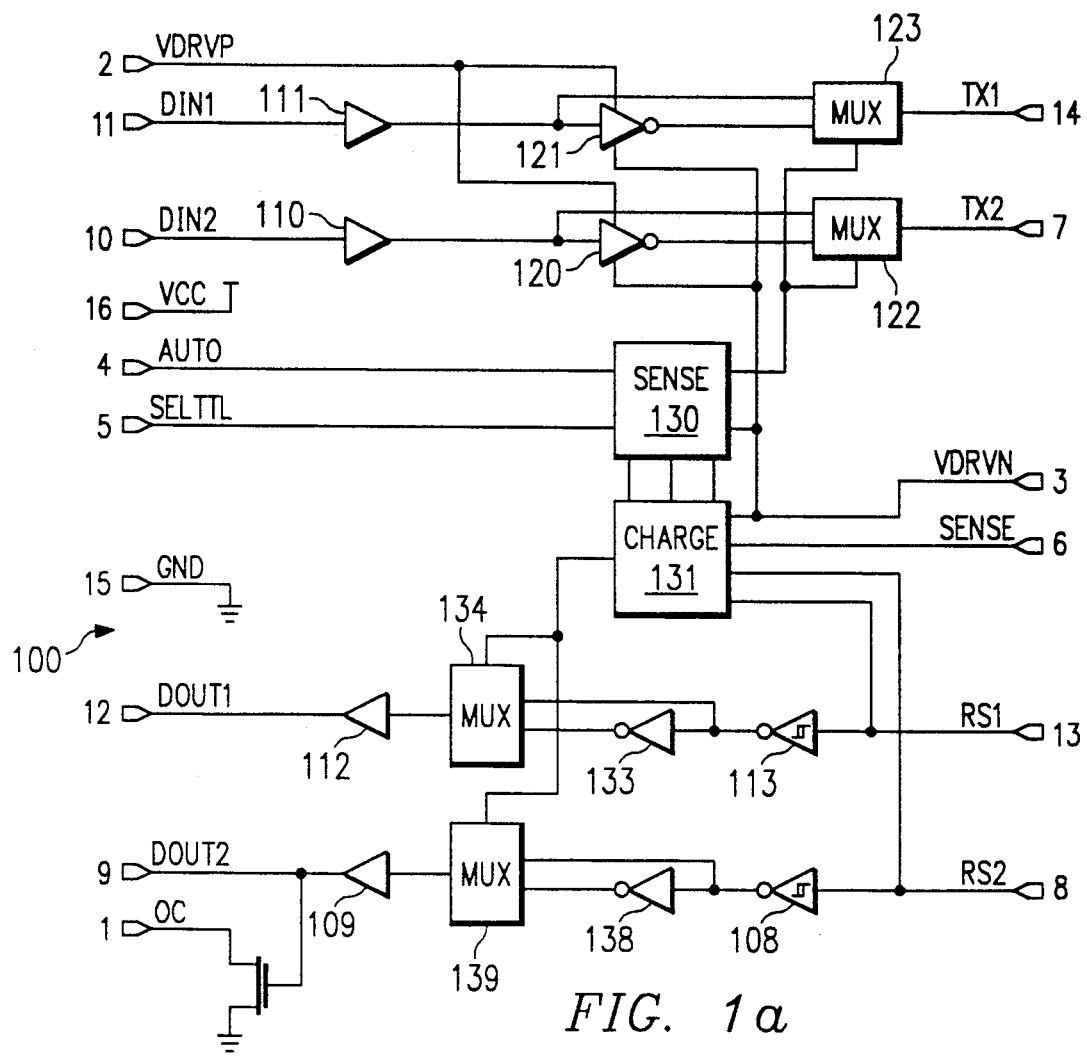
FIG. 1a is a functional block diagram of a first preferred embodiment.

FIG. 1a is a functional block diagram of the first preferred embodiment transceiver, denoted by reference numeral 100, which includes two RS232 level inputs RS1 and RS2 (pins 8 and 13), two RS232-to-TTL inverting buffers 108 and 113, two inverters 133 and 138, two multiplexers 134 and 139 for selecting between the direct buffer 108 and 113 outputs and the inverted outputs from inverters 133 and 138, two TTL level output buffers 109 and 112, two TTL level outputs DOUT1 and DOUT2 pins 12 and 9) plus an output complement OC (pin 1), two TTL inputs DIN1 and DIN2 (pins 10 and 11), two buffers 110 and 111, two inverters 120 and 121 which output RS232 levels, two multiplexers 122 and 123 for selecting between the TTL levels from 110 and 111 and the RS232 levels from 120 and 121, two outputs TX1 and TX2 which can be at either TTL or RS232 levels (pins 7 and 14), Vcc power intput (pin 16) with Vcc typically about +5 volts, ground GND (pin 15), high voltage (+12 volts) drive power supply VDRVP (pin 2), low voltage (−12 volts) drive power supply VDRVN (pin 3), SENSE circuitry 130, CHARGE circutry 131, mode select input AUTO (pin 4), TTL/RS232 select input SELTTL (pin 5), and sense input SENSE (pin 6). Transceiver 100 is designed for operation with both TTL and RS232 level interfaces. SENSE circuitry 130 permits transceiver 100 to be set to either automatically sense the interface being used, or be under processor control for interface selection. When in the automatic mode, if TTL levels are preset on the SENSE pin 6, the driver and receiver circuits (108, 113, 120, and 121) have standard TTL level thresholds and impedances. If RS232 levels are preset on SENSE pin 6, then the driver and receiver circuits have standard RS232 level thresholds and impedances.

Transceiver 100 can be used in circuits for RS232 applications which have a negative voltage source available. When powered with a negative voltage on SENSE pin 6, transceiver 100 cannot be operated in the automatic mode; and instead, a processor must drive the SELTTL pin 5 to select the input and output levels and the mode select AUTO pin 4 must be tied to ground.

Transceiver 100 applies to battery operated systems in that an RS232 device consumes system power during both negative and positive transitions of the RS232 trasmit signals. If the connector for the RS232 port were left connected for any appreciable time after a communications session had ended, then one would expect power to statically flow into the transmitters and thus drain the battery capacity. Transceiver 100 avoids this static current drain by stealing current from the RS232 receive inputs and any unused control signal on the RS232 interface when that line is at a negative voltage level and charging an external reservoir capacitor at pin 3 which provides the negative RS232 voltage for the transmitters when the receive lines are at a positive voltage level.

When transceiver 100 is in the automatic mode of operation, the thresholds to be used are determined by sampling the voltage on the sense pin 6. If the voltage is at ground potential or positive, transceiver 100 will use TTL levels for the drivers and receivers and the receivers will present a high impedance to any connnected drivers. If the sampled voltage at pin 6 is from −12 volts to −3 volts, then transceiver 100 will use RS232 levels for the drivers and receivers and the receivers will present an impedance of typically 5 KΩ to any attached drivers.

When transceiver 100 is in the RS232 mode of operation, the receivers have an input hysteresis between −3.0 volts and +3.0 volts; any signal in this range will be ignored. The receivers will also present an impedance of between 3 and 7 KΩ to any attached driver.

When transceiver 100 is in the TTL mode of operation, the receivers have input thresholds equivalent to TTL logic: a logic one must be a minimum of +2.2 volts and a logic zero must be a maximum of +0.8 volt. The receivers will present a standard high impedance input to any attached drivers.

When transceiver 100 is in the RS232 mode of operation, the transmitters (120 and 121) derive the required negative voltage levels from a reservoir capacitor at pin 3. The capacitor is initially charged from a negative voltage applied to the sense pin 6; this voltage is usually derived from an unused signal on the RS232 interface. After the reservoir capacitor has been charged to sufficient negative level by the sense pin 6, power is stolen from both the sense pin 6 and the RS232 receiver input whenever they switch to a negative voltage. This power is used to continuously recharge the reservoir capacitor and thus provide a negative voltage supply to the drivers.

When the PS232 output drivers 120 and 121 need to transition to a positive level, transceiver 100 will use the voltage applied to the high voltage pin 2; this voltage can vary from +5 volts to +12 volts. Vcc at pin 16 can thus be tied to pin 2; and when the Vcc power supply is removed from pin 2, and high voltage is still active, no current will be drawn from pin 16 if the driver output is left floating. If the driver output is loaded during such a condition, the pin 16 input will not draw current so long as the receiver inputs are at a negative voltage potential. When in the RS232 mode of operation, the driver outputs are slew limited to less than 30 volts/usec as per the RE232 C/D specifications. When in the TTL mode of operation, the drivers meet the standard TTL specifications with a maximum rise and fall time of 20 nsec. A logic one is a minimum of +2.2 volts and a logic zero is a maximum of +0.8 volt. Of course, typical CMOS levels of a +5 volt logic one and a 0 volt logic zero satisfy the TTL specifications.

Figure 1B:
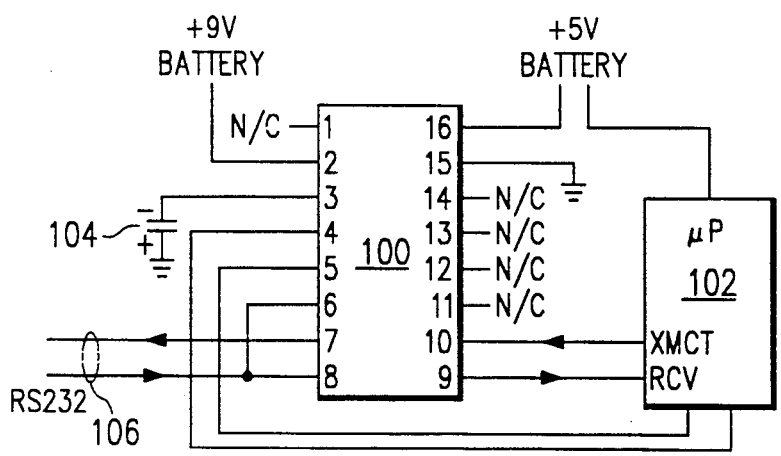
FIG. 1b illustrates an application of the first preferred embodiment.

FIG. 1b shows a battery power sourced application of transceiver 100 with one port (pins 9 and 10) connected to microprocessor 102 and using TTL/CMOS level signals, the corresponding port (pins 7 and 8) connected to an RS232 line 106, 10 uF reservoir capacitor 104 attached to pin 3, sense pin 6 attached to the receive RS232 line at pin 8, mode and select pins 4 and 5 connected to microprocessor 102 although these pins could be left floating and transceiver would automatically sense the type of connection to pins 7 and 8, Vcc pin 16 connected to a +5 volt battery, VDRVP pin 2 connected to a +9 volt battery, and pin 15 connected to ground. If RS232 line 106 is removed and a TTL/CMOS level line attached to pins 7 and 8, then transceiver 100 will sense the change and the output at pin 7 will switch to TTL/CMOS levels from the previous RS232 levels and the 5 KΩ input impedance at pin 8 for RS232 inputs will switch to high impedance for TTL/CMOS inputs.

Figure 2:
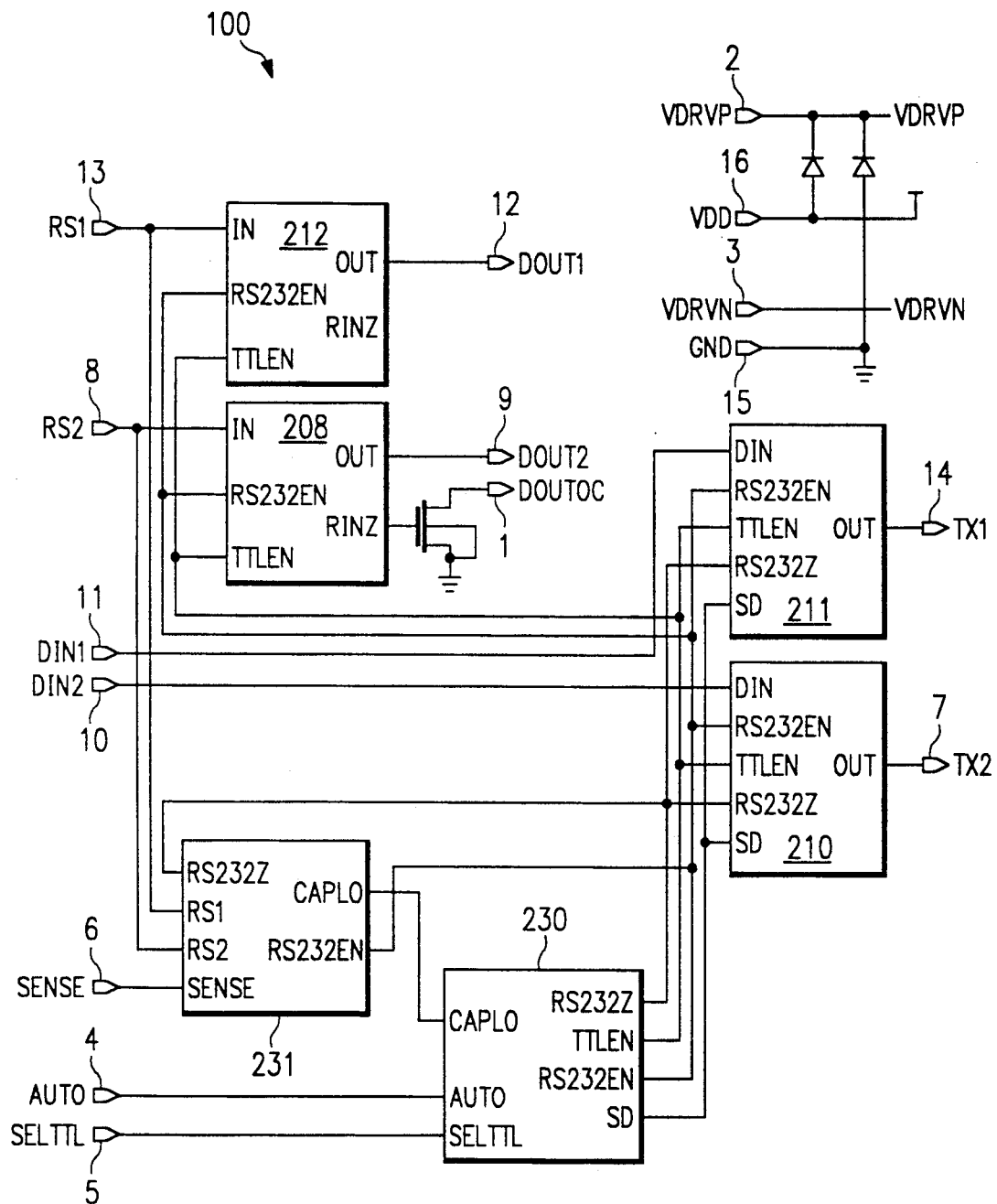
FIG. 2 is a schematic block diagram of the first preferred embodiment.

FIG. 2 is a schematic block diagram of transceiver 100 and shows the sixteen pins, two transmit block 210 and 211, two receive blocks 208 and 212, charge block 231, sense block 230, and the diode connections between VDRVP pin 2 and VDD (Vcc) power supply pin 16 and ground pin 15.

Figure 3:
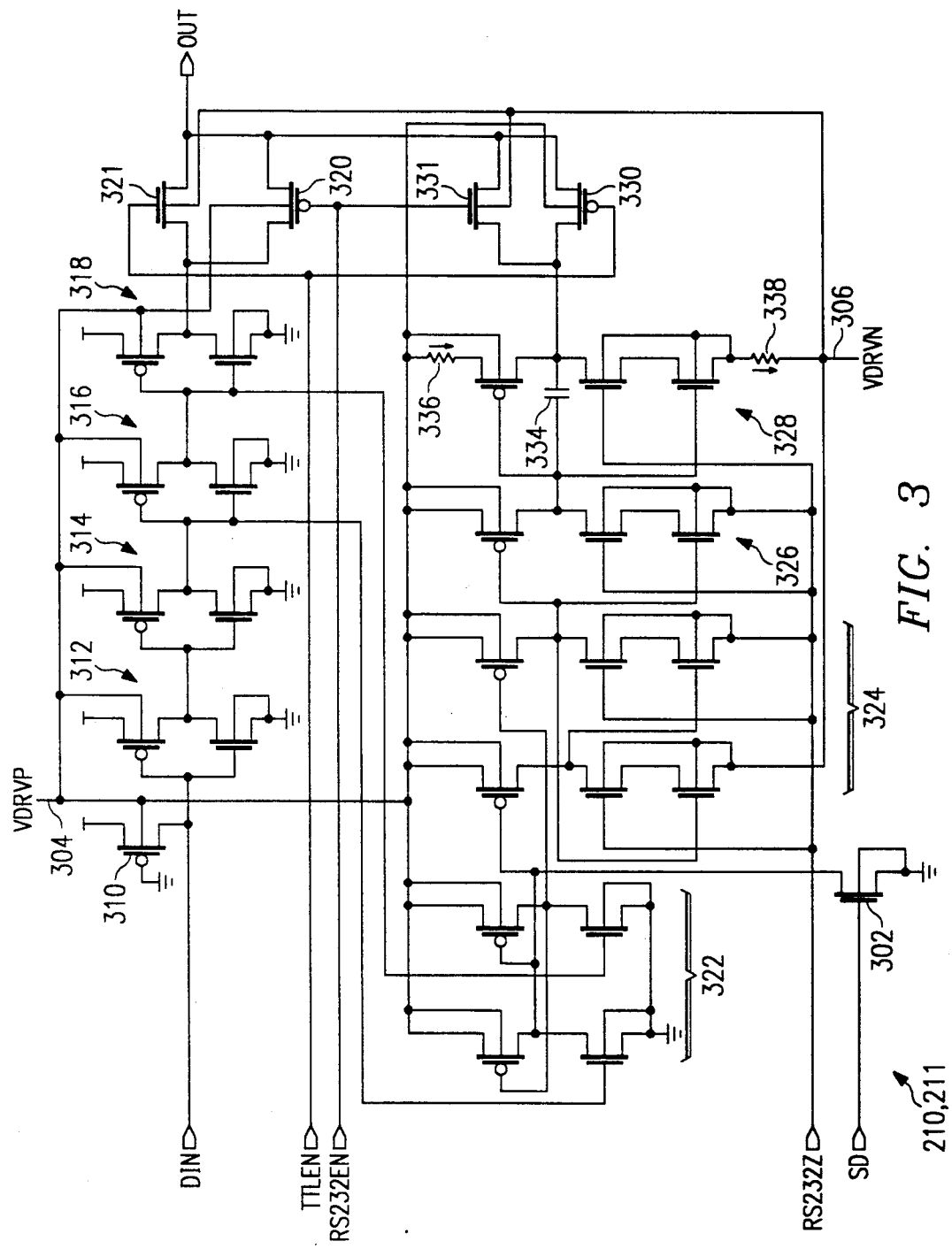
FIG. 3–6 are schematic circuit diagrams of the blocks of FIG. 2.

FIG. 3 is a schematic circuit diagram of each of transmit blocks 210 and 211. These blocks each basically translates TTL levels input at DIN into either high power TTL with fast slew rate or RS232 specification output at OUT. Indeed, inverters 312, 314, 316, and 318 form a buffer stage which applies power gain to the input signal to output a signal which can drive a transmission cable at TTL levels and speeds. Level translators 322 and 324 translate the TTL voltages from the buffer 312-318 into a signal which switches from VDRVP to VDRVN levels. The signal polarity reversal is deterined by the tap off points from the buffer 312-318. Inverters 326 and 328 provide slew rate limitation and current limitation to meet RS232 specifications. Transmission gates 320-321 and 330-331 together with RE232EN and TTLEN select either the TTL output from buffer 312-318 or the RS232 output of inverter 328. In more detail, receiver 210 or 211 operates as follows.

RS232 enable input RS232EN is high (typically +12 volts) if RS232 levels are to be output and low (typically −12 volts) if TTL levels are to be output at OUT, and TTL enable input TTLEN is essentially the complement of RS232EN and is high if TTL levels are to be output and low if RS232 levels are to be output at OUT. Input RS232Z provides a turn on bias (+5 volts) to the series n-channel FETs in level shifter 324 and inverters 326 and 328 when RS232 levels are to be output; these series FETs provide a voltage drop and help prevent breakdown of the adjacent driven n-channel FETs when the full possible 30 volts appears across the driven n-channel FET (+15 volts at node VDRVP and −15 volts at node VDRVN are possible RS232 levels). Shutdown input SD provides a shutdown with a high signal (greater than 1 volt so as to turn on n-channel FET 302), positive drive voltage (VDRVP) node 304 typically provides about +12 volts during operation with an RS232 line attached, and negative drive voltage (VDRVN) node 306 typically provides about −12 volts during operation with an RS232 line attached. P-channel FET is a high impedance pull up of DIN so a floating DIN1 or DIN2 (pins 10 or 11) is held high. CMOS inverters 312 and 314 buffer the TTL input at DIN, inverter 312 has a threshold of about 1.3 volts (middle of the low-high gap for TTL levels), and CMOS inverters 316 and 318 provide output drive for TTL levels at OUT. Indeed, the gate widths of the p-channel and n-channel FETs increase from inverter 312 to inverter 318 to generate the power gain. These inverters all operate between Vcc/Vdd (+5 volts) and ground. The output of inverter 318 passes through the transmission gate formed by p-channel FET 320 and n-channel FET 321 to OUT; the transmission gate is conducting when TTLEN is high (turning on FET 321) and RS232EN is low (turning on FET 320).

The inputs to driver inverters 316 and 318 are also directed to the inputs of level translator 322; the p-channel n-channel series FETs of level translator 322 are connected between VDRVP (+12 volts) and ground and thus have outputs varying between ground and +12 volts. The outputs of level translator 322 feed level translator 324 which has a p-channel and two n-channel FETs in series between VDRVP (+12 volts) and VDRVN (−12 volts), so the output varies between these extremes. Note that the n-channel FETs biased by RS232Z are on and used to deter breakdown of the other n-channel FETs. The output of level translator 324 feeds CMOS inverter drivers 326 and 328 (operating between VDRVP and VDRVN). The output of inverter driver 328 passes through the transmission gate made of p-channel FET 330 and n-channel FET 331 to output at OUT RS232-level inverted versions of the TTL input from DIN. That is, a low (0 to +0.8 volt) at DIN yields a high (+12 volts) at OUT, and a high (2.2 to 5 volts) at DIN yields a low (−12 volts) at OUT. Transmission gate 330331 is conducting when RS232EN is high (turning on FET 331) and TTLEN is low (turning on FET 330). Note that capacitor 334 across inverter driver 328 and series resistors 336 and 338 provide a slew rate limit on the output to conform to RS232 specifications.

Figure 4:
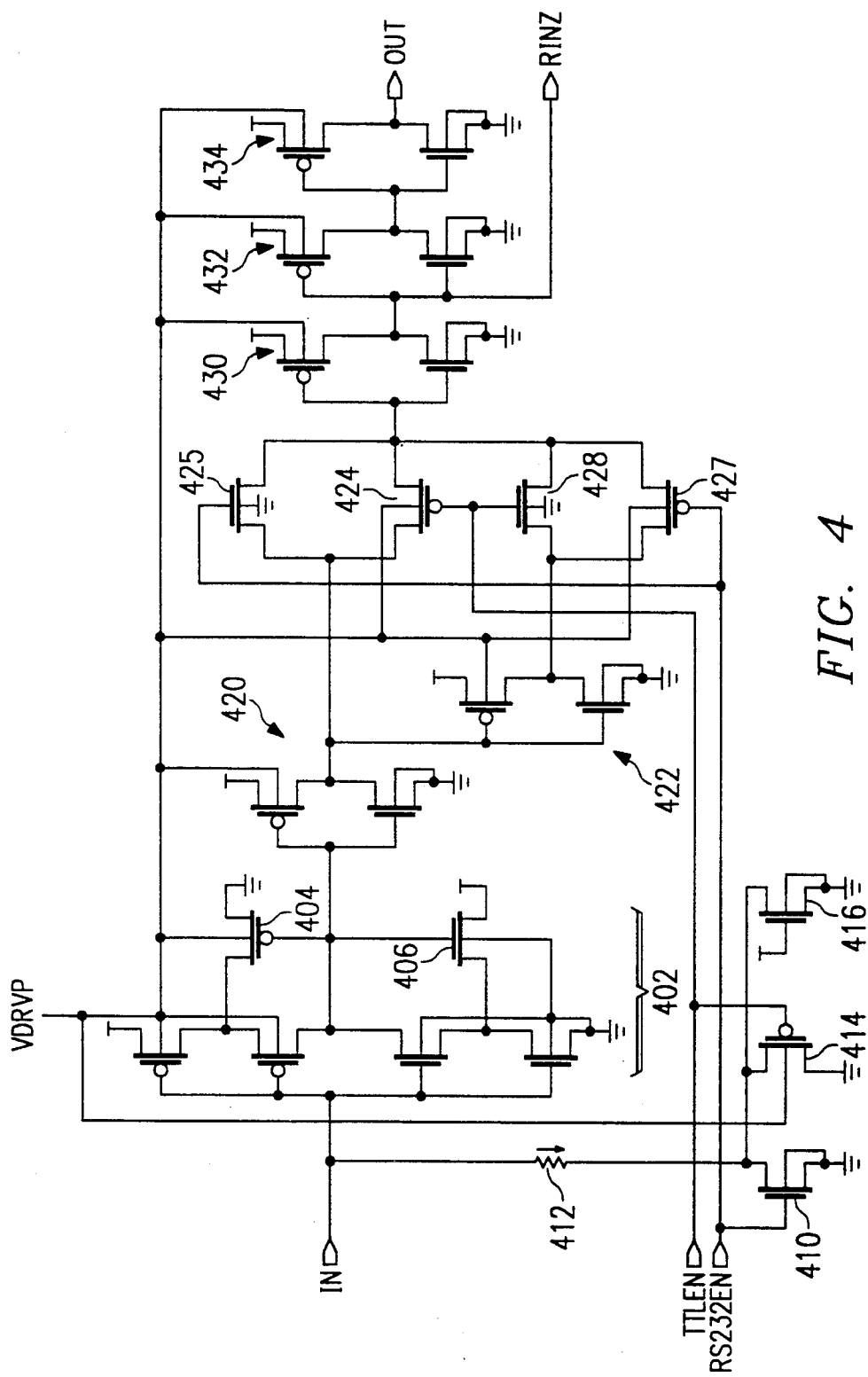

FIG. 4 is a schematic circuit diagram of each of receivers 208 and 212 which basically is a hysteresis input buffer (inverters 402, 420, and 422) feeding a multiplexer (transmission gates 424-425 and 427-428) that selects the receive polarity depending upon TTLEN and RE232EN. Power gain is applied by inverters 430, 432, and 434, and resistor 412 and FETs 410, 414, and 416 apply the appropriate input impedance. In more detail the receiver operates as follows.

RS232-level inputs at input IN are dropped to CMOS levels by inverter 402 which also provides some hysteresis by the feedback of FETs 404 and 406. The output of inverter 402 is inverted back to the IN polarity by inverter 420 and inverted again by inverter 422 to the opposite of IN polarity. The choice of which polarity to pass to inverter 430 comes from RS232EN and TTLEN. If RS232EN is high (and TTLEN thus low) then the output of inverter 420 (IN polarity) passes to inverter 430 through the transmission gate formed by p-channel FET 424 and n-channel FET 425, whereas if RS232EN is low (and TTLEN high) then the output of inverter 422 (opposite of IN polarity) passes to inverter 430 through the transmission gate formed by p-channel FET 427 and n-channel FET 428. The output of inverter 430 is powered up and output at OUT by inverter drivers 432 and 434 at CMOS levels. Thus if RS232EN is high (and TTLEN low), then the net effect of 402, 420, 430, 432, and 434 is an inversion from IN to OUT; whereas, if TTLEN is high (and RS232EN low), then the net from IN to OUT is without inversion.

If RS232EN is high (RS232 selected), then n-channel FET 410 turns on and provides a 5 kΩ load resistor 412 between IN and ground which conforms to the RS232 standards; also TTLEN low turns on p-channel FET 414 which parallels FET 410, and high impedance n-channel FET 416 is always turned on and provides a high impedance path to ground (weak pull down) even when TTL is selected.

Note that in the static mode (with a steady approximate −12 volts at IN and VDRVN and +12 volts at VDRVP) minimal power is consumed by the CMOS gates (both 5 volt and +−12 volt) in receivers 208 and 212 and transmitters 210 and 211, and the power dissipated in load resistor 412 is supplied by the RS232 line. Pullup FET 310 has minimal drain on Vdd if input DIN is low and none if DIN is high.

Figure 5:
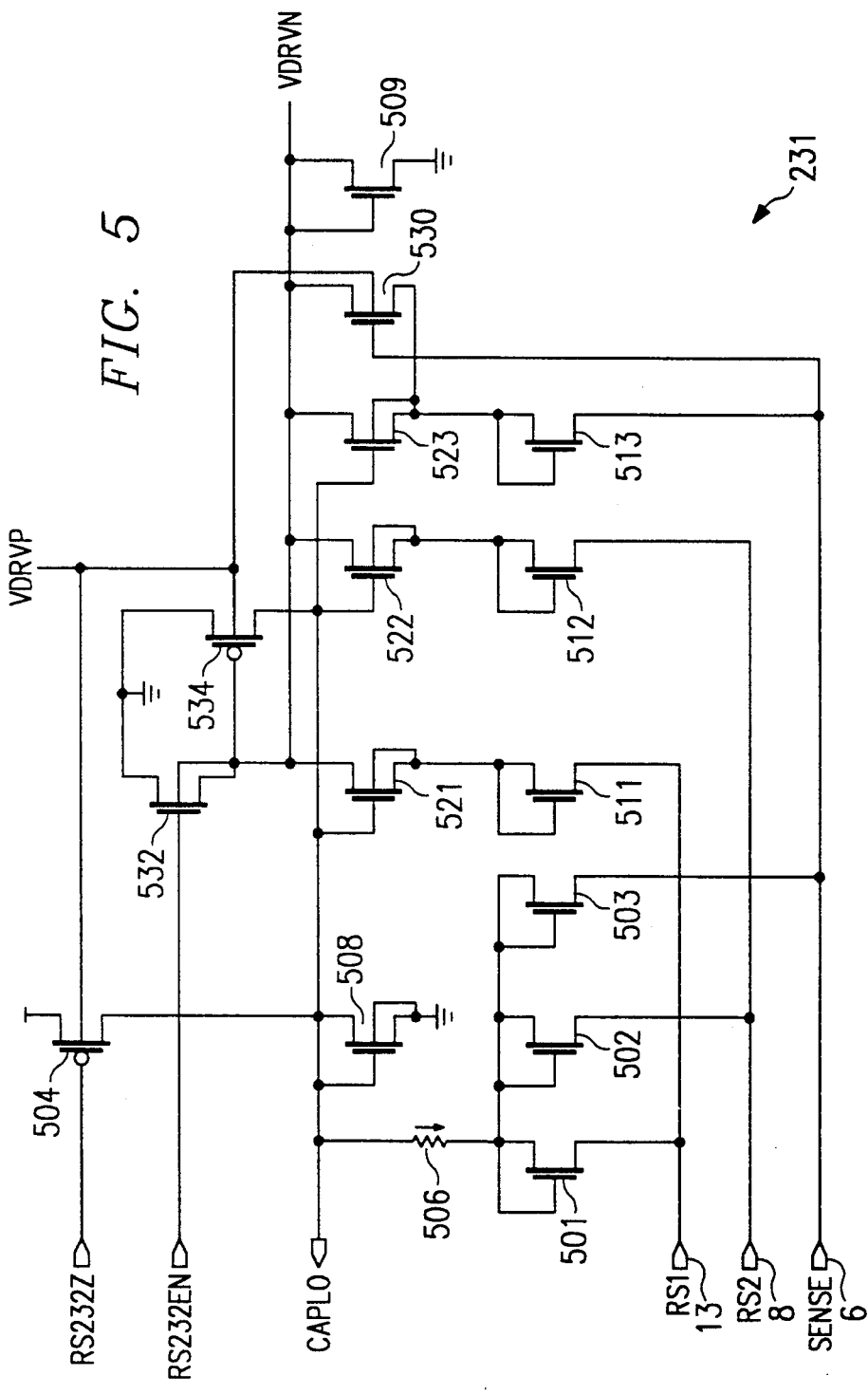
Figure 6:
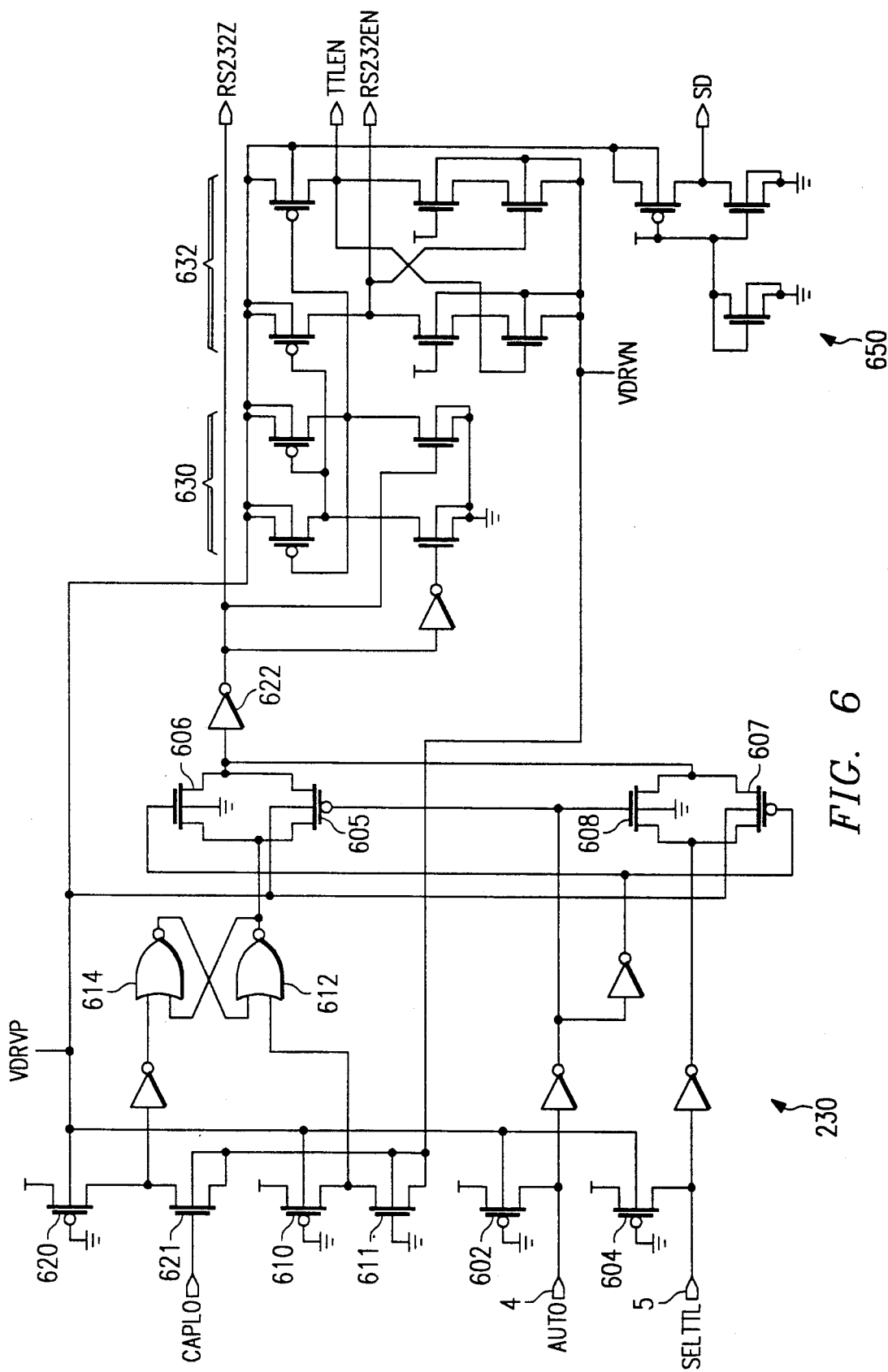

FIGS. 5 and 6 are schematic circuit diagrams of charge block 231 and sense block 230 which operate as follows. First presume that the mode select input AUTO (pin 4) and the TTL/RS232 select SELTTL (pin 5) are floating, sense pin 6 (SENSE) is tied to an attached RS232 line and thus is at −12 volts most of the time, both RS232 input pin 8 (RS2) and pin 13 (RS1) are attached to RS232 lines and at −12 volts, a 10uF reservoir capacitor is connected to pin 3 (VDRVN) but is initially discharged so VDRVN is initially 0 volts, pin 2 (VDRVP) is at +12 volts, Vdd pin 16 is at +5 volts as is node RS232Z, and RS232EN is at 0-volts. These conditions represent the start up mode of operation just after an RS232 line is connected to transceiver 100 at inputs RS1 and RS2.

Under these conditions, resistor 506 will quickly pull down the voltage on CAPLO node to approximately one diode drop above the SENSE node; that is, the diode connected FETs 501-503 discharge node CAPLO to about −11 volts. P-channel FET 530 will have a negative voltage from gate to source and be turned on. The gate width to length of FET 530 is small and FET 530 provides a moderate impedance (500 Ω) and limits current flow from VDRVN (and 10 uF reservoir capacitor) through diode connected n-channel FET 513 to the SENSE node at −12 volts. This is a surge limited charging of the 10 uF reservoir capacitor: see FIG. 7.

As VDRVN ramps down, p-channel FET 534 turns on to raise the voltage on node CAPLO to about one threshold below ground. The thresholds of the p-channel FETs and the n-channel FETs have about the same magnitudes of about 1 volt. Thus node CAPLO is pulled up from its initial −11 volts to about −1.5 volts; see FIG. 7. This rise of CAPLO turns on n-channel FETs 521-523 to provide a lower resistance path for the continued charging of the 10 uF reservoir capacitor. Thus node VDRVN ramps down more quickly; see FIG. 7. After a delay from the switching of latch 612-614 (see discussion below), node RS232Z will switch from Vdd (+5 volts) to 0 volts, and node RS232EN will switch from VDRVN (ramping down) to VDRVP (+12 volts). As RS232Z goes low, FET 504 turns on to pull up node CAPLO to Vdd (+5 volts) and thereby turning on FETs 521-523 even harder to further lower the resistance of the path from the 10 uF reservoir capacitor and node VDRVN to the inputs RS1, RS2, and SENSE. Note that FET 534 has a higher on impedance than FET 504, so node CAPLO is pulled up to +5 volts and not down to 0 volts. As RS232EN goes high, it turns on n-channel FET 532 which provides a discharge path for VDRVN when RS1, RS2, and SENSE are disconnected, but FET 532 has a moderate on impedance and does not pull VDRVN up as long FETs 521-523 are on. With VRDVN at about −12 volts the circuit is in normal operating mode.

In normal operating mode the only current drain path for Vdd is through FET 504, resistor 506 (about 25 KΩ), and diode connected FETs 501-503. And VDRVP has no drain path except substrate leakage; thus the drain of the positive power supplies is limited. The negative power is supplied from the RS232 line by "current stealing" to charge the 10 uF reservoir capacitor. The switching of RS1, RS2, and SENSE from −12 volts to +12 volts and back has no effect on the capacitor stored −12 volts at node VDRVN. Input isolation is provided by the floating diode connected FETs 501-503 and 511-513.

Next, consider the change in operation of charge circuit 231 from the normal operating mode upon disconnection of the RS232 lines RS1, RS2, and SENSE. That is, prsume that VDRVP and RS232EN are +12 volts, Vdd and CAPLO are +5 volts, RS232Z is 0 volts, VDRVN is −12 volts, and that RS1, RS2, and SENSE are switched from −12 volts to foating.

Figure 8:
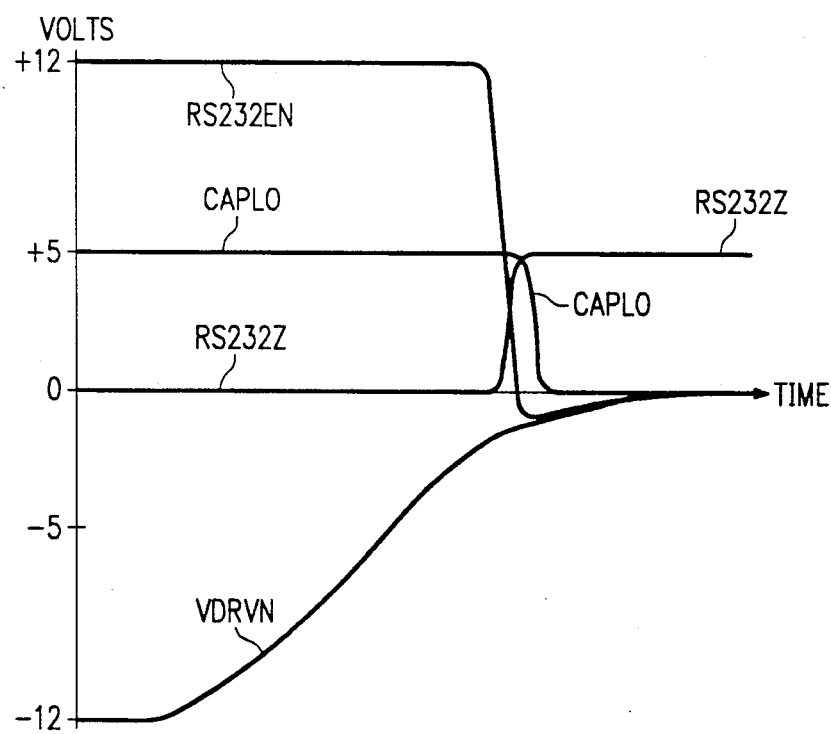

Since there is no "current stealing" path to maintain the negative voltage on VDRVN and the 10 uF reservoir capacitor, they will begin to discharge through FET 532 (moderate turned on impedance). Eventually, latch 612-614 Will switch states (see discussion below) and RS232EN will go from VDRVP (+12 volts) to VDRVN (approaching 0 volts) and this will turn off FET 532. Also, RS232Z will go from 0 to +5 volts and turn off FET 504 which removes the gate drives to FETs 521-523. Thus the circuit returns to the condition just prior to connection of the RS232 lines. Diode connected n-channel FET 509 prevents VDRVN from floating to a voltage greater than one diode drop above ground. Diode connected n-channel FET 508 provides a high resistance path to ground to keep CAPLO from floating high. See FIG. 8.

Figure 7:
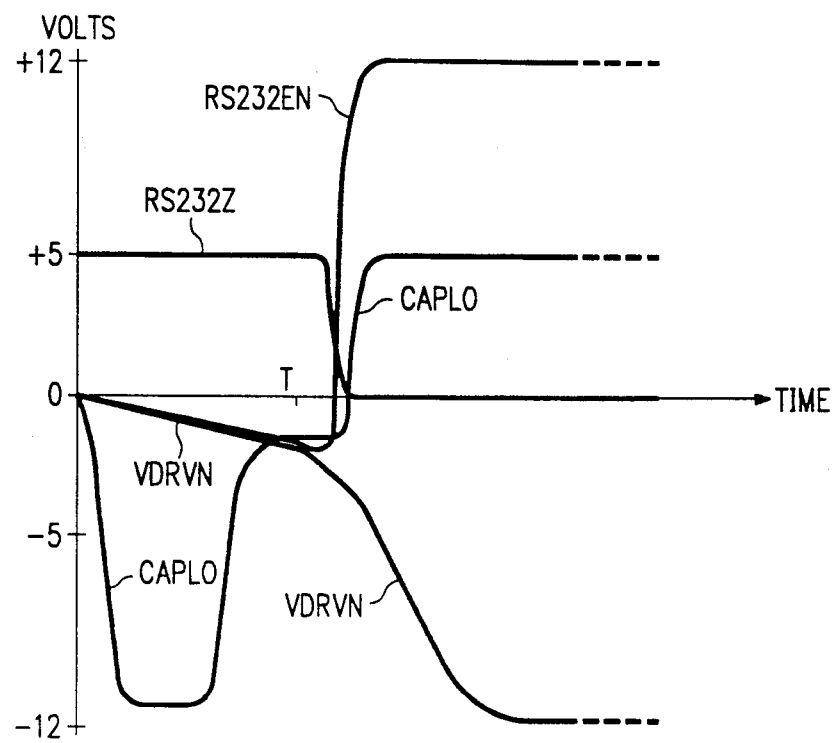
FIGS. 7–8 are timing diagrams

FIG. 6 schematically shows sense circuit 230. As with the explanation of the operation of charge circuit 231, presume a startup condition as indicated in FIG. 7 for time T. That is, VDRVP is +12 volts, Vdd is +5 volts, VDRVN is negative but still somewhat close to 0 volts, CAPLO is about −1.5 volts (roughly a threshold below ground), and AUTO and SELTTL are floating. Thus the high impedance pull up p-channel FETs 602 and 604 pull nodes AUTO (pin 4) and SELTTL (pin 5) up to +5 volts, and the high impedance pull up p-channel FETs 620 and 610 will likewise pull the drains of n-channel FETs 621 and 611 to Vdd (+5 volts). FET 621 has a gate input CAPLO which is presumed about −1.5 volts and a source at VDRVN which is presumed close to 0 volts, so FET 621 is off and its drain holds at +5 volts. Similarly, the gate of FET 611 is grounded and the source is at VDRVN which is close to 0. Thus FET 611 is also off and its drain holds at +5 volts. The high drain of FET 611 feeds one input of the latch made of NOR gate 612 and 614, and the inverted high drain of FET 621 feeds the other latch input. Thus NOR gate 612 is low and NOR gate 614 is high. Now the high at node AUTO makes the transmission gate formed by p-channel FET 605 and n-channel FET 606 conducting and the transmission gate formed by p-channel FET 607 and n-channel FET 608 nonconducting, so the low of NOR gate 614 passes through transmission gate 605-606 and is inverted by inverter 622 to output a high (Vdd) at node RS232Z as previously presumed. This output of inverter 622 also feeds to level translators 630 and 632 and then to complementary output nodes TTLEN and RS232EN. Level translator 630 operates between VDRVP and ground, and level translator 632 operates between VDRVP and VDRVN. Thus initially the output at node TTLEN is high (VDRVP level of +12 volts) and the output at node RS232EN is low (VDRVN which is somewhat close to ground).

The low output of latch 612-614 persists until VDRVN becomes sufficiently negative: as VDRVN drops to about -1 volt the source of FET 611 (connected to VDRVN) becomes about a threshold below the grounded gate, and FET 611 begins to turn on. This pulls the drain of FET 611 down to about VDRVN and removes one of the high inputs to NOR gate 614. Next, as VDRVN drops to about −2.5 volts, the source of FET 621 (also connected to VDRVN) becomes about a threshold below the gate tied to CAPLO at about −1.5 volts. Thus FET 621 turns on and its drain drops to about −2.5 volts: this is inverted and feeds a high to NOR gate 614 which switches low and thereby applies a second low to NOR gate 612 to drive it high. Thus RS232Z switches low (0 volts), TTLEN goes low (VDRVN about −2.5 volts), and RS232EN goes high to +12 volts. Thus the connection to RS232 lines to RS1 or RS2 has been detected by transceiver 100 and transmit blocks 210 and 211 are put into the RS232-level output mode. Of course, the 10 uF rservoir capacitor continues to charge and VDRVN continues to drop to −12 volts as previously described.

Now consider the change in operation of sense circuit 231 from normal operating mode upon the disconnection of the RS232 lines from RS1 and RS2. As noted in connection with the discussion of FIG. 5, disconnection of the RS232 lines curtails the "current stealing" and the 10 uF reservoir capacitor and node VDRVN begin discharging. As node VDRVN rises to about −1 volt (a threshold voltage below ground), FET 611 will turn off and its drain will be pulled high by FET 610. (Recall that CAPLO had previously been pulled up to +5 volts, so FET 621 remains on.) The high drain of FET 611 switches NOR gate 614 low and RS232Z returns to high (+5 volts), TTLEN switches low (VDRVN which is about −1 volt) to high (+12 volts), and RS232EN switches high (+12 volts) to low (VDRVN at −1 volt). These switches then drive CAPLO back low; see FIG. 8.

Note that the switching of CAPLO from −1.5 volts to 5 volts after connection of RS232 lines provides a 1.5 volt hysteresis in the level of VDRVN that switches latch 612-614 between connection and disconnection of RS232 lines. This suppresses certain possible instabilities.

If the inputs at RS1, RS2, and SENSE had all been TTL level, then VDRVN would remain about ground, and node TTLEN would remain high, and transmit blocks 210 and 211 would remain in the TTL level output mode.

FIG. 6 shows that a low applied to node AUTO (pin 4) will switch transmission gate 605-606 to nonconducting (and thereby cutoff latch 612-614) and transmission gate 607-608 to conducting. Transmission gate 607-608 passes the input on node SELTTL to inverter 622 and thence to nodes RS232Z, TTLEN, and RS232EN; if a high is input at SELTTL, then TTLEN and RS232Z go high and RS232EN goes low, and if a low is input at SELTTL, then TTLEN and RE232Z are low and RS232EN is high. That is, forcing AUTO low permits manual override of the automatic sensing of RS232 operation and forced TTL level outputs through RS232EN and TTLEN which control the transmit block multiplexers (transmission gates 320-321 and 330-331).

Level translators 630 and 632 also provide a method of translating TTL signals (such as input on SELTTL) to greater swings: the TTLEN output swings between VDRVP which is at least Vdd and VDRVN which is at most ground.

Pull up high impedance FETs 602, 604, 620, and 621 are the only static power drain o Vdd in circuit 230, and if AUTO and SELTTL are floating there is no current path for FETs 602 and 604 to ground so there is no power drain in these paths.

FIG. 6 also shows shut down circuit 650 which will output a low at node SD for Vdd above 5 volts, but will switch to a high (VDRVP) if Vdd drops to about 2.5 volts. This provides a shut down of the transmit blocks 210 and 211 by FET 302 (see FIG. 3).

FIG. 7 is a timing diagram illustrating the RS232 line connection and disconnection behavior.

MODIFICATIONS AND VARIATIONS

The preferred embodiments can be modified while retaining the features of an automatic sensing of the type of signals received to adjust the type of signals transmitted; an adaptive transmitter with selectable polarity, slew rate, and voltage levels; the use of surge limited current stealing from the received signals to power transmitted signals, and hysteresis sensing of voltages beyond reference voltages. Modifications and variations include different device types, such as all NMOS or bipolar or a mixture (BiCMOS) with bipolar drivers and MOS logic, resistors could be used in place of pull up FETs, only a single input and output port or three or more input and output ports can be operated, different circuit realization of the features could be used such as p-n junction or Schottky diodes in place of the diode connected FETs, negative supplies and current stealing from positive received signals, the transceiver could be integrated into a device such as a CMOS microcontroller and the TTL ports would just be part of the microcontroller, and so forth.

What is claimed is:

1. A transceiver, comprising:
   (a) a first input terminal;
   (b) a first output terminal:
   (c) a first driver coupled to said first output terminal, said first driver having at least two modes of operation with said two modes of operation corresponding to different driver output voltage ranges;
   (d) a sense circuit coupled to said first input terminal and said first driver, said sense circuit selecting the mode of operation of said first driver in response to characteristics of input signals received at said first input terminal;
   (e) a second input terminal coupled to said first driver;
   (f) a second output terminal;
   (g) a second driver coupled to said second output terminal and to said first input terminal;
   (h) wherein said first driver transmits signals at said first output terminal in response to input signals received at said second input terminal, and said second driver transmits signals at said second output terminal in response to input signals received at said first input terminal.

2. The transceiver of claim 1, wherein:
   (a) said first driver has a first mode of operation compatible with RS232 specifications and a second mode of operation compatible with TTL specifications.

3. The transceiver of claim 2, wherein:
   (a) said first input terminal receives signals compatible with either RS232 specifications or TTL specifications and connected circuitry provides a corresponding input impedance;
   (b) said second input terminal receives signals compatible with TTL specifications; and
   (c) said second driver transmits signals compatible with TTL specifications.

4. The transceiver of claim 1, further comprising:
   (a) a charge circuit coupled to said first input terminal and said first driver, said charge circuit drawing energy from signals received at said first input terminal and supplying energy to said first driver.

5. The transceiver of claim 4, further comprising:
   (a) a storage capacitor coupled to said charge circuit and storing portions of said energy drawn from said signals.

6. A method of communication, comprising the steps of:
   (a) providing a driver for transmission of signals, said driver with at least two modes of operation with said two modes of operation corresponding to different driver output voltage ranges;
   (b) receiving signals at an input terminal;
   (c) sensing the characteristics of said received signals; and
   (d) selecting the mode of operation of said driver in accordance with the sensed characteristics of said received signals.

* * * * *